United States Patent [19]
Lin et al.

[11] Patent Number: 6,093,246
[45] Date of Patent: Jul. 25, 2000

[54] PHOTONIC CRYSTAL DEVICES FORMED BY A CHARGED-PARTICLE BEAM

[75] Inventors: Shawn-Yu Lin, Albuquerque, N. Mex.; Hans W. P. Koops, Ober-Ramstadt, Germany

[73] Assignee: Sandia Corporation, Albuquerque, N. Mex.

[21] Appl. No.: 08/574,810

[22] Filed: Dec. 19, 1995

[30] Foreign Application Priority Data

Sep. 8, 1995 [DE] Germany ............................. 19533148

[51] Int. Cl.[7] ................................................. C30B 29/02
[52] U.S. Cl. ............................................................. 117/928
[58] Field of Search ................................... 359/321, 322; 117/92, 105, 108, 928, 937; 118/723 CB, 723 EB; 257/17; 427/487; 385/1; 372/50, 99, 41; 343/792.5, 793, 795; 333/157, 164

[56] References Cited

U.S. PATENT DOCUMENTS

| | | | |
|---|---|---|---|
| 4,002,998 | 1/1977 | Conwell et al. | 372/96 |
| 4,021,674 | 5/1977 | Koops | 250/492 A |
| 4,595,876 | 6/1986 | Kuhara et al. | 359/322 |
| 5,008,737 | 4/1991 | Burnham et al | 372/36 |
| 5,325,228 | 6/1994 | Matsubara et al. | 359/322 |
| 5,365,541 | 11/1994 | Bullock | 372/50 |
| 5,385,114 | 1/1995 | Milstein et al. | 117/1 |
| 5,386,215 | 1/1995 | Brown | 343/795 |
| 5,406,573 | 4/1995 | Ozbay et al. | 372/43 |
| 5,440,421 | 8/1995 | Fan et al. | 257/17 |
| 5,541,613 | 7/1996 | Lam et al. | 343/792.5 |
| 5,541,614 | 7/1996 | Lam et al. | 343/792.5 |
| 5,600,342 | 2/1997 | Pikulski et al. | 343/795 |
| 5,625,636 | 4/1997 | Bryan et al. | 372/50 |
| 5,646,425 | 7/1997 | Beach | 372/43 |

FOREIGN PATENT DOCUMENTS

| | | | |
|---|---|---|---|
| 24 60 716 | 12/1976 | Germany | H01J 37/30 |
| 25 15 550 | 5/1977 | Germany | H01J 37/04 |
| 24 60 715 | 10/1979 | Germany | H01J 37/30 |

OTHER PUBLICATIONS

Ozbay et al; "Laser Machined Millimeter Wave Photonic Band–Gap Structures"; Appl. Phys. Lett.; vol. 67, No. 14; Oct. 1995.

E. Yablonovitch, "Inhibited Spontaneous Emission in Solid–State Physics and Electronics," *Physical Review Letters*, vol. 58, pp. 2059–2062, May 18, 1987.

H. W. P. Koops, R. Weiel, D. P. Kern, and T. H. Baum, "High–Resolution Electron–Beam Induced Deposition," *Journal of Vacuum Science and Technology*, vol. B6, pp. 477–481, Jan./Feb. 1988.

M. Rub, H. W. P. Koops, and T. Tschudi, "Electron Beam Induced Deposition in a Reducing Image Projector," *Microelectronic Engineering*, vol. 9, pp. 251–254, 1989.

E. Yablonovitch and T. J. Gmitter, "Photonic Band Structure: The Face–Centered–Cubic Case," *Physical Review Letters*, vol. 63, pp. 1950–1953, Oct. 30, 1989.

S. L. McCall and P. M. Platzman, "Microwave Propagation in Two–Dimensional Dielectric Lattices," *Physical Review Letters*, vol. 67, pp. 2017–2020, Oct. 7, 1991.

(List continued on next page.)

*Primary Examiner*—Rodney Bovernick
*Assistant Examiner*—Robert E. Wise
*Attorney, Agent, or Firm*—John P. Hohimer

[57] ABSTRACT

A photonic crystal device and method. The photonic crystal device comprises a substrate with at least one photonic crystal formed thereon by a charged-particle beam deposition method. Each photonic crystal comprises a plurality of spaced elements having a composition different from the substrate, and may further include one or more impurity elements substituted for spaced elements. Embodiments of the present invention may be provided as electromagnetic wave filters, polarizers, resonators, sources, mirrors, beam directors and antennas for use at wavelengths in the range from about 0.2 to 200 microns or longer. Additionally, photonic crystal devices may be provided with one or more electromagnetic waveguides adjacent to a photonic crystal for forming integrated electromagnetic circuits for use at optical, infrared, or millimeter-wave frequencies.

33 Claims, 5 Drawing Sheets

OTHER PUBLICATIONS

E. Yablonovitch and T. J. Gmitter, "Donor and Acceptor Modes in Photonic Band Structure," *Physical Review Letters*, vol. 67, pp. 3380–3383, Dec. 9, 1991.

S. Y. Lin and G. Arjavalingam, "Tunneling of Electromagnetic Waves in Two–Dimensional Photonic Crystals," *Optics Letters*, vol. 18, pp. 1666–1668, Oct. 1, 1993.

J. Kretz, M. Rudolph, M. Weber, and H. W. P. Koops, "Three–Dimensional Structurization by Additive Lithography, Analysis of Deposits Using TEM and EDX, and Application to Field–Emitter Tips," *Microelectronic Engineering*, vol. 23, pp. 477–481, 1994.

S. Y. Lin and G. Arjavalingam, "Photonic Bound States in Two–Dimensional Photonic Crystals Probed by Coherent–Microwave Transient Spectroscopy," *Journal of the Optical Society of America B*, vol. 11, pp. 2124–2127, Oct. 1994.

E. Ozbay, G. Tuttle, J. S. McCalmont, M. Sigalas, R. Biswas, C. M. Soukoulis, and K. M. Ho, "Laser–Micromachined Millimeter–Wave Photonic Band–Gap Cavity Structures," *Applied Physics Letters*, vol. 67, pp. 1969–1971, Oct. 2, 1995.

PHOTONIC CRYSTAL DEVICES FORMED BY A CHARGED-PARTICLE BEAM

This invention was made with Government support under Contract No. DE-AC04-94AL85000 awarded by the U.S. Department of Energy. The Government has certain rights in the invention.

FIELD OF THE INVENTION

The present invention relates generally to photonic crystals, and in particular to photonic crystal devices formed by a deposition or growth process initiated by a charged-particle beam.

BACKGROUND OF THE INVENTION

Photonic crystals (also termed photonic bandgap structures) are currently being investigated for electromagnetic (EM) wave applications. Such photonic crystals have a two- or three-dimensional periodic array structure in which the propagation of EM waves is governed by band-structure types of dispersion relationships. These photonic crystals provide electromagnetic analogs to electron-wave behavior in crystals, with electron-wave concepts such as reciprocal space, Brillouin zones, dispersion relations, Bloch wave functions, van Hove singularities and tunneling having electromagnetic counterparts in photonic crystals. This will enable the development of many new and improved types of photonic crystal devices, including devices in which optical modes, spontaneous emission, and zero-point fluctuations are greatly reduced or inhibited. Photonic crystals may also be formed with local disturbances in the periodic array structure, thereby generating defect or cavity modes with frequencies within a forbidden bandgap of the crystal for forming additional types of photonic crystal devices, including high-Q resonators and filters.

The photonic crystals formed heretofore have generally been formed by machining processes whereby material is removed from a substrate or the like for forming the crystals. These machining processes, using conventional machine tools (e.g. mechanical drills and mills) or laser ablative machining, have been used for forming photonic crystals having bandgaps at microwave or millimeter-wave frequencies. Material removal from a substrate by etching or ion milling has also been proposed for forming photonic crystals.

An advantage of the method of the present invention is that photonic crystal devices may be formed by a selective growth process using irradiation with a charged-particle beam such as an electron beam or an ion beam, with a plurality of spaced elements therein being located with a very high precision (down to a few nanometers).

Another advantage of the present invention is that use of charged-particle-beam assisted growth of one or more photonic crystal devices upon a substrate allows the devices to be formed at predetermined locations on the substrate and with a predetermined periodicity.

Another advantage of the present invention is that a plurality of spaced elements may be simultaneously formed on or above a surface of a substrate by the use of charged-particle-beam assisted deposition, with different elements having the same or different dimensions, spacings, or compositions.

These and other advantages of the photonic crystal device and method of the present invention with become evident to those skilled in the art.

SUMMARY OF THE INVENTION

Accordingly, it is a primary object of the present invention to provide a photonic crystal device wherein one or more photonic crystals comprising a plurality of spaced elements are formed on or above a surface of a substrate at predetermined locations wherein growth is initiated (i.e. material is deposited) in response to an incident charged-particle beam.

An additional object of the present invention is to provide a photonic crystal device formed by a charged-particle beam deposition method, with the device further including at least one electromagnetic waveguide formed above the substrate adjacent to a photonic crystal.

A further object of the present invention is to provide a charged-particle beam method for forming a photonic crystal device wherein a plurality of spaced elements are formed on or above a surface of a substrate with predetermined dimensions provided by a control unit such as a computer or the like that provides for positioning a charged-particle beam at predetermined locations on the surface of the substrate, or that positions a patterned mask in the path of the charged-particle beam to provide an image of the mask pattern at the surface of the substrate.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a photonic crystal device and a method for forming such a device are provided. The photonic crystal device comprises a substrate; and at least one photonic crystal formed on or above a surface of the substrate, each photonic crystal comprising a plurality of spaced elements having a composition different from the substrate. The photonic crystal device may further include one or more impurity elements substituted for spaced elements, with each impurity element having a composition and/or an index of refraction different from that of the remaining spaced elements. According to some embodiments of the present invention, the photonic crystal device may further include one or more electromagnetic (EM) waveguides formed above the surface of the substrate and positioned adjacent to the photonic crystal for communication of an electromagnetic wave therewith so that the photonic crystal may provide an interaction with the electromagnetic wave (e.g. altering a propagation characteristic of the wave, filtering the wave, redirecting the wave, or resonating with the wave).

The method for forming the photonic crystal device comprises sorbing (i.e. absorbing or adsorbing) precursor molecules on a surface of a substrate; irradiating the sorbed precursor molecules at a plurality of predetermined locations on the surface of the substrate with a charged-particle beam; and forming the photonic crystal device at least in part by chemically converting (by exposure to the charged-particle beam) the sorbed precursor molecules at a majority of the predetermined locations into a first nonvolatile substance having a composition different from that of the substrate, and further having predetermined dimensions and a first index of refraction. The method for forming the photonic crystal device may further include a step for forming an impurity element at one or more of the predetermined locations, with the impurity element having a composition different from the first substrate (and preferably different from the substrate), and further having a second index of refraction different from the first index. Additionally, the method may include a step for providing a spacer material between a plurality of spaced elements within the photonic crystal device, with the spacer material having a third index of refraction different from the first index. Furthermore, according to some embodiments of the present invention, the method may include a step for forming at least one EM waveguide above the surface of the substrate for conveying an EM wave along a predetermined path parallel to the substrate, with the plurality of spaced elements being located in the path of the EM wave for interacting therewith.

Other objects, advantages and novel features of the invention with become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
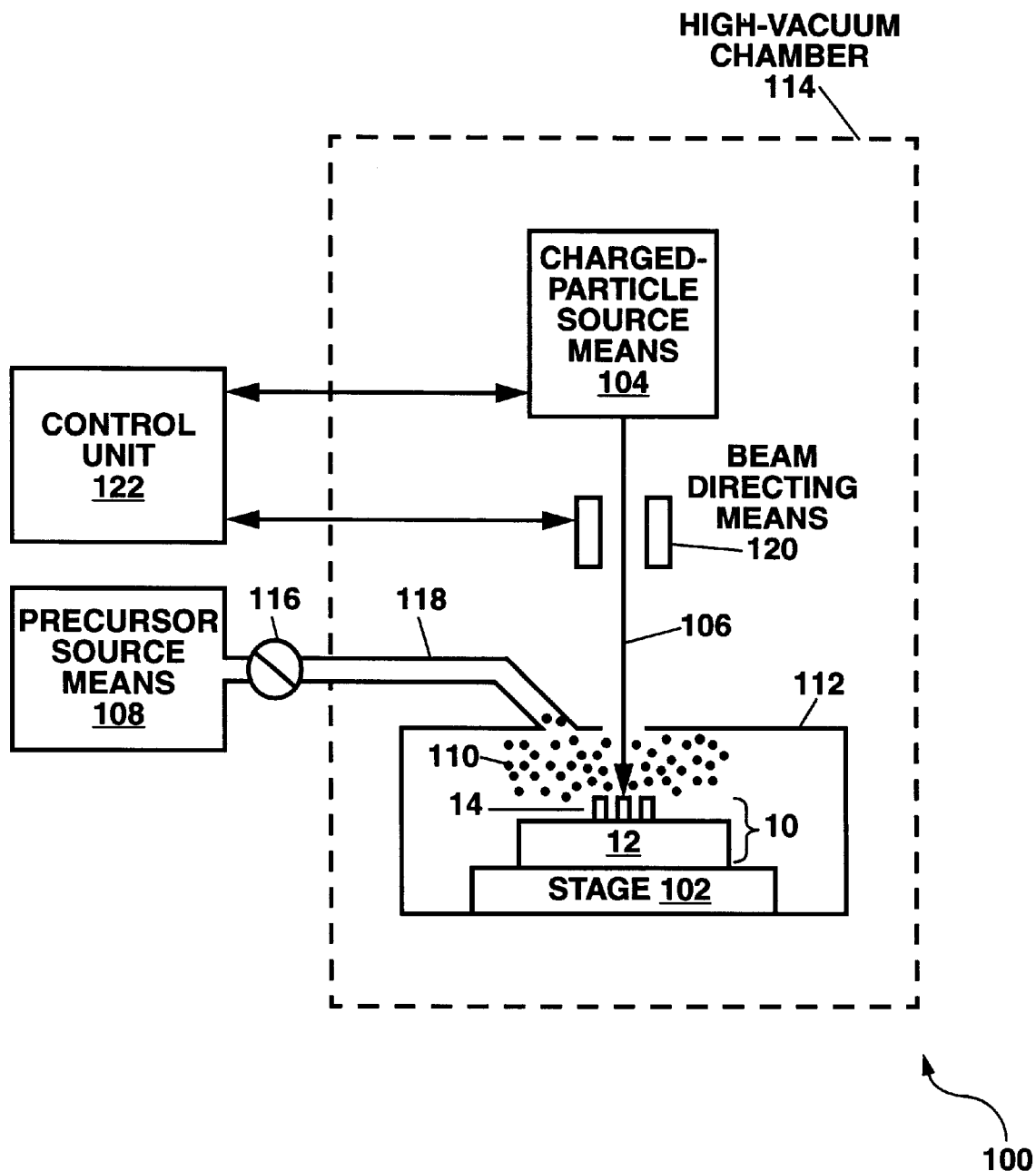
FIG. 1 shows a schematic diagram of a charged-particle beam apparatus for forming a photonic crystal device according to the present invention.

Referring to FIG. 1, there is shown a schematic diagram of a charged-particle beam apparatus 100 for forming a photonic crystal device 10 according to the present invention. The apparatus 100 comprises a stage 102 for holding a substrate 12 upon which at least one photonic crystal 14 is grown for forming the device 10. The apparatus 100 further comprises charged-particle source means 104 for providing a charged-particle beam 106 incident upon a surface of the substrate, and precursor source means 108 for providing a precursor substrate 110 (i.e. precursor molecules) to the substrate for growing the photonic crystal thereon. A first vacuum chamber 112 (i.e. a low-vacuum chamber) generally surrounds the photonic crystal device and precursor molecules with an opening for admitting the charged-particle beam; and a second vacuum chamber 114 (i.e. a high-vacuum chamber) is provided for enclosing the charged-particle source means 104 and the first vacuum chamber.

The precursor source means 108 generally comprises an oven containing a sealed vessel holding a quantity of the precursor substance, with the sealed vessel being connected through a valve 116 and tubing 118 to the first vacuum chamber. For forming the photonic crystal device 10, the precursor substance is heated to a sufficiently high temperature for forming a vapor with a pressure that is generally in the millitorr range. The vapor is conveyed by tubing 118 to the first vacuum chamber 112 to provide precursor molecules 110 therein for sorption on the substrate to form or grow the photonic crystal 14 by a charged-particle beam deposition method.

In some embodiments of the present invention, the precursor source means 108 may further include a gas stream (e.g. an inert gas) for conveying the precursor molecules to the first chamber. Furthermore, the tubing 118 wherein the precursor molecules are transported may be terminated by a nozzle or the like for directing the precursor molecules onto a surface of the substrate wherein the precursor molecules are to be sorbed (i.e. absorbed or adsorbed).

For forming the photonic crystal device 10, a substrate is positioned within the first vacuum chamber on stage 102. The stage may include a Peltier cooler or the like for heating or cooling the substrate for controlling the sorption of precursor molecules thereon. The substrate preferably comprises an electrically conductive material (or a material having an electrically conductive upper surface or a surface layer formed thereon), with the substrate further being connected to an electrical ground to dissipate any charge accumulated on the substrate from the incident charged-particle beam. Suitable substrate materials may include dielectric materials and semiconductors (e.g. Si, GaAs, InP); and a particular substrate will generally be preselected depending upon a particular type of photonic crystal device to be formed, a wavelength of operation of the device, and whether or not other elements (e.g. electromagnetic waveguides) are to be formed on or within the substrate.

In FIG. 1, the charged-particle beam 106 with an energy of about 5–50 keV or more impinges on the exposed surface of the substrate, transforming the sorbed precursor molecules at the location of the incident beam into a first nonvolatile substance. The charged-particle beam 106 may be either an electron beam or an ion beam (e.g. Ga$^+$), with the charged-particle source means 104 being an electron beam source or an ion beam source, respectively. Any volatile by-products produced by the charged-particle beam interacting with the sorbed molecules are preferably removed by a vacuum pump connected to the first vacuum chamber.

The incident charged-particle beam 106 may be positioned at one or more predetermined locations on or above the surface of the substrate for growing elements 16 of a photonic crystal 14 thereon. In some embodiments of the present invention, the incident beam 106 may be focused to a predetermined size (about the size of the elements 16 to be formed or smaller) at the surface of the substrate, and raster scanned over the surface dwelling at predetermined locations for sufficient time to convert the precursor molecules (e.g. by polymerizing the precursor molecules) into the first nonvolatile substance forming a plurality of spaced elements 16 of the photonic crystal. In these embodiments, a beam directing means 120 (e.g. an electrostatic or magnetostatic deflector) is preferably provided for positioning the charged-particle beam 106 on the surface of the substrate. The beam directing means may be controlled by a control unit 122 such as a computer or the like for defining an energy of the charged-particle beam 106, for positioning or raster scanning the beam (e.g. using patterning information stored within the control unit), and for controlling a dwell time at each predetermined portion of the surface of the substrate. The control unit may further receive an electrical input from a secondary electron detector (not shown) for forming a secondary electron image of the surface of the substrate for display or for locating the photonic crystal relative to other elements (e.g. electromagnetic waveguides) on the substrate. (Secondary electrons are generated by the charged-particle beam impinging on the surface of the substrate, or on elements of the photonic crystal being formed thereon.)

In other embodiments of the present invention, a mask (not shown) may be disposed in the path of the charged-particle beam, with shaped apertures in the mask defining a pattern of an incident charged-particle beam to be projected onto the surface of the substrate with a predetermined magnification or reduction for forming a plurality of spaced elements of the photonic crystal. These latter embodiments of the invention may be advantageous for reducing a total exposure time for forming the photonic crystal device 10 since a plurality of spaced elements 16 may be formed simultaneously. (A charged-particle beam apparatus with a mask provided in the beam path for irradiating a specimen in a two-dimensional pattern for exposing an electron-sensitive layer of material such as a photoresist has been disclosed in U.S. Pat. No. 4,021,674, which is incorporated herein by reference.)

Figure 2:
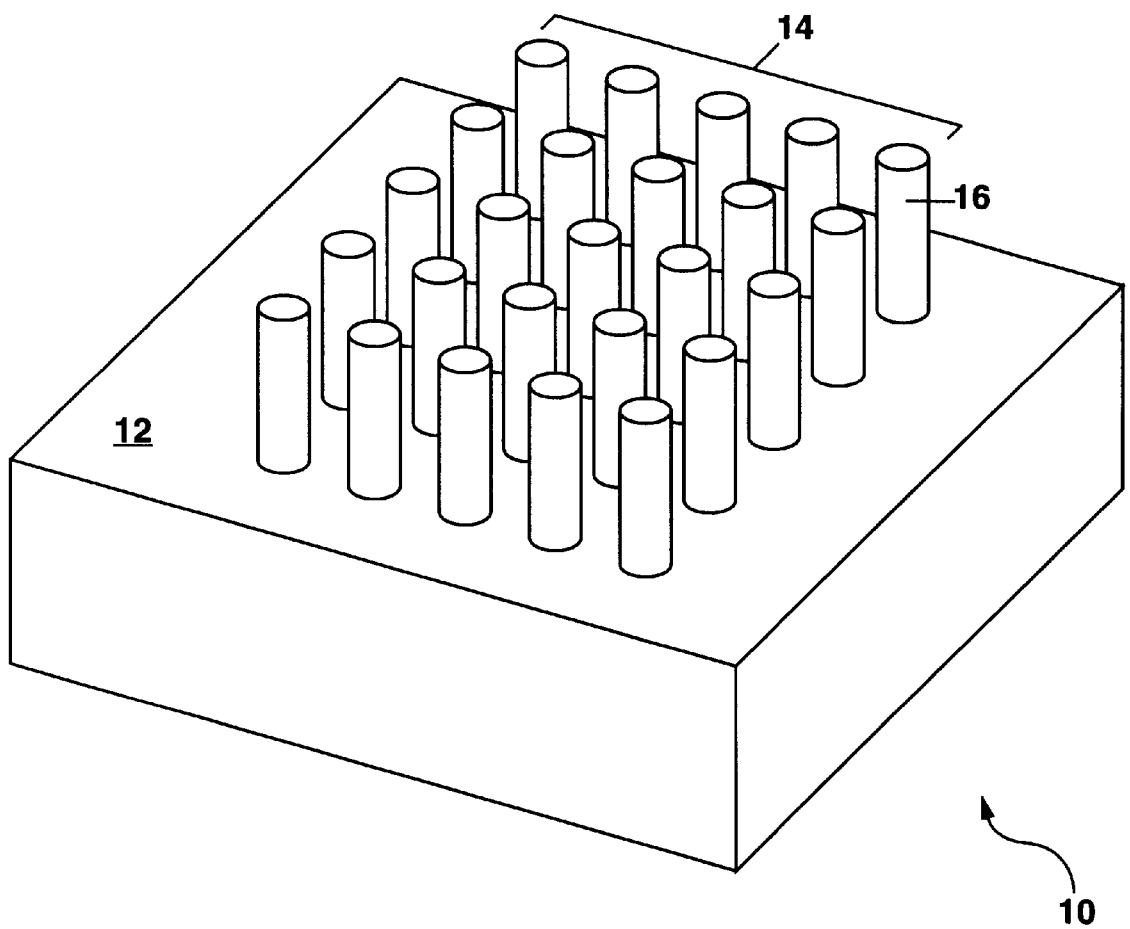
FIG. 2 shows a perspective view of a first example of a photonic crystal device formed according to the present invention, with the device comprising a plurality of upward-extending spaced elements in the form of pillars or rods.

FIG. 2 shows a first example of a photonic crystal device 10 formed according to the method of the present invention. In this first example, the device 10 comprises a plurality of spaced elements 16 in the form of pillars or rods extending upward from a surface of a substrate 12, with the pillars having a first index of refraction, $n_1$, that is preferably about 2 or larger. The pillars are formed at predetermined locations wherein the charged-particle beam (e.g. an electron beam) is incident upon sorbed precursor molecules, converting the sorbed molecules into a first nonvolatile material (e.g. by polymerizing the sorbed molecules to grow or deposit the first material).

The pillars in FIG. 2 have a cross-sectional size and shape (in the plane of the surface of the substrate) and a periodicity (i.e. a unit cell spacing for repetition of a pattern or array formed by the pillars) that may be determined, for example, by a size and shape of the incident charged-particle beam, or by a pattern of a mask disposed in the path of the beam. For forming the photonic crystal 14 in FIG. 2, the pillars may have any shape, although a cylindrical shape may be preferred for ease of analysis of operation of the photonic crystal device 10. Furthermore, although the pillars in FIG. 2 are shown in the form of a square array, other array patterns are possible including triangular and hexagonal arrays. Finally, although the pillars in FIG. 2 are shown with a uniform width, the width of the pillars may be varied in the growth direction, for example, by varying a size of the charged-particle beam, or by providing a plurality of masks in the path of the charged-particle beam during growth of the pillars.

In general, the shaped elements 16 may be formed in any two- or three-dimensional array pattern as known to the art. Furthermore, the size and periodicity of the pillars (i.e. the spaced elements 16) will be predetermined depending upon a particular wavelength of electromagnetic (EM) waves for which the completed photonic crystal device 10 is to be used, and further depending upon a predetermined refractive index of the first material forming the pillars. For example, a periodicity for the spaced elements 16 in the example of FIG. 2 may be about one-half the wavelength of EM waves to be propagated through the device 10 (in a direction parallel to the substrate), with a cross-sectional width or diameter of the spaced pillars being about one-quarter of the wavelength, and a height of the spaced pillars preferably being at least twice the wavelength. (The wavelength of EM waves as defined herein is equal to a vacuum wavelength of the EM waves divided by an index of refraction, n, of any medium or material through which the waves propagate.) The wavelength of the EM waves may range from about 0.2 to 200 microns or more depending upon the type of photonic crystal device 10 being formed.

In forming the plurality of spaced elements 16 shown in FIG. 2, a variety of precursor substances (i.e. precursor molecules) may be used. Precursor substances are defined herein as any materials that may be initially sorbed on the substrate and undergo a chemical reaction in response to an incident charged-particle beam, thereby being converted into the first nonvolatile material that is formed or deposited on the substrate. Precursor substances may comprise inorganic, organic, and metalorganic materials in the form of monomers, polymers, and mixtures of monomers and polymers that may be volatilized with or without heating for delivery to the substrate for sorption thereon. Examples of precursor substances are organometallics (including metal carbonyls), hydrocarbon compounds (e.g. acetyl-acetonate complexes wherein acetyl-acetonate is bound to a heavy center atom such as gold) and tungsten hexafluoride. Further examples of acetyl-acetonate complexes, which may be preferred for certain embodiments of the present invention in which the charged-particle beam is an electron beam, include dimethyl-gold-trifluoro-acetylacetonate [ also termed $Me_2Au(tfac)$] and diethyl-gold-acetylacetonate [ also termed $Me_2Au(acac)$]. Diethyl-gold-acetylacetonate has a vapor pressure of about 8.5 millitorr at 25° C., and a decomposition temperature of about 160° C. Additional precursor substances will become known with practice of the present invention.

The formation of the spaced elements 16 will generally proceed at a rate that is determined by a combination of factors including an available supply of the volatile precursor substance (i.e. its vapor pressure and a rate of sorption on the surface of the substrate), a particle flux or current of the incident charged-particle beam, and the temperature of the substrate. Furthermore, a composition and index of refraction of the deposited first material may be adjusted by varying the energy of the incident charged-particle beam. (The composition and index of refraction of the first material deposited with a low charged-particle beam current or flux may be altered by a subsequent exposure to a larger charged-particle beam current. Furthermore, for some first materials, an electrical conductivity thereof may be controlled and varied over a range of several orders of magnitude by adjusting the charged-particle beam current, with a larger electrical conductivity being provided by a larger beam current.) Finally, one or more of the spaced elements may have a second index of refraction, $n_2$, that is different from that of the remaining spaced elements. Such an element may be termed an impurity element 18 by analogy to a crystal wherein impurity atoms are doped (e.g. a doped semiconductor) to alter properties of the crystal. These impurity elements 18 may be formed by changing the energy or current of the incident charged-particle beam at preselected locations wherein the impurity elements are to be formed. Alternately, different precursor molecules may be provided (before or after formation of a majority of the spaced elements) for sorption onto the substrate for forming the impurity elements 18 by irradiation with the charged-particle beam. In some embodiments of the present invention, impurity elements 18 may be provided simply by omitting one or more of the spaced elements from a photonic crystal 14 formed on the substrate.

The photonic crystal 14 according to the first example of the present invention may comprise a plurality of spaced elements 16 in the form of pillars separated by air as shown in FIG. 2; or the region between the spaced pillars may be filled in with a spacer material 20 (e.g. a dielectric material) having a predetermined third index of refraction, $n_3$, and preferably being transparent or invisible to an incident EM wave. The spacer material 20 (shown in FIGS. 3 and 4) may be deposited by the charged-particle beam deposition method as described heretofore but with different precursor molecules; or by a conventional deposition method (e.g. chemical vapor deposition or sputter deposition); or by spin-on deposition method (e.g. a process whereby a liquid spacer material in the form of a resist, polymer, spin-on glass or the like is spun over the surface of the substrate and cured by heating, with or without a polishing step for planarizing the cured spacer material).

Figure 3:
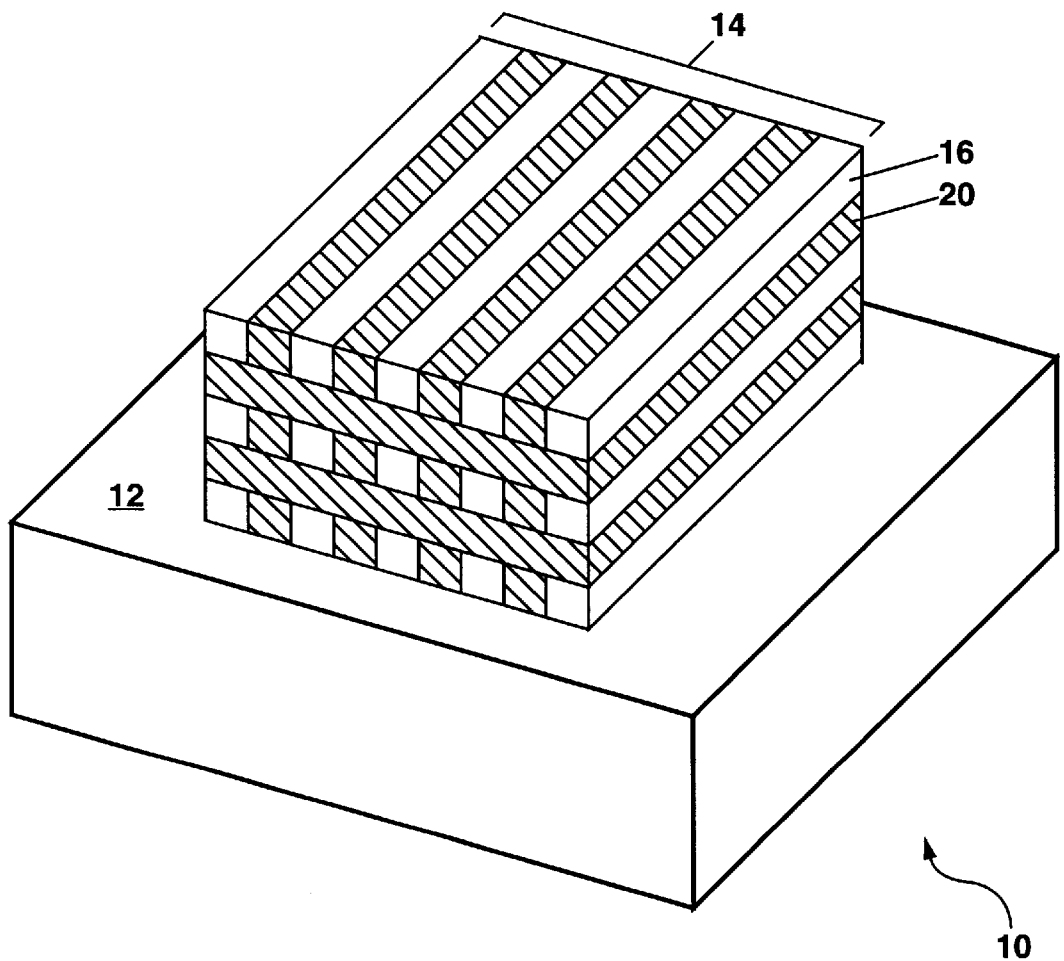
FIG. 3 shows a perspective view of a second example of a photonic crystal device formed according to the present invention, with the device comprising a plurality of laterally-extending spaced elements separated by a spacer material.

FIG. 3 shows a perspective view of a second example of a photonic crystal device 10 formed according to the present invention, with the device comprising a plurality of spaced elements 16 separated by spacer material 20. In FIG. 2, the spaced elements are in the form of pillars or rods extending laterally in a direction parallel to the surface of the substrate. The pillars as shown in FIG. 3 are rectangular in shape and have a uniform size, although other shapes (e.g. cylindrical) may be used. The exact shape of the spaced elements for forming a particular photonic crystal device will become evident from practice of the present invention. For some embodiments of the present invention, a size and/or periodicity of the shaped elements 16 may be varied across the crystal (e.g. to form a lens for focusing an incident EM wave).

In forming such laterally-extending spaced elements, the charged-particle deposition method may be used to form the elements 16, with the charged-particle beam being scanned along a line for forming each element or a plurality of elements being formed simultaneously by providing a mask with spaced parallel slits therein for projecting a line image of the charged-particle beam. The spacer material 20 may be provided between the spaced elements by any of the deposition methods described heretofore, with separate deposition steps being provided for forming each horizontal row of the spaced elements of FIG. 2. (A single deposition step may be used to form the spacer material between the spaced elements within a row, and to cover or blanket that row of elements.) Additionally, alignment marks may be provided on the substrate outside the photonic crystal 14 for aligning each row of the spaced elements 16. Furthermore, according to some embodiments of the present invention, one or more of the spaced elements may be replaced or substituted by impurity elements 18 as described heretofore.

Figure 4:
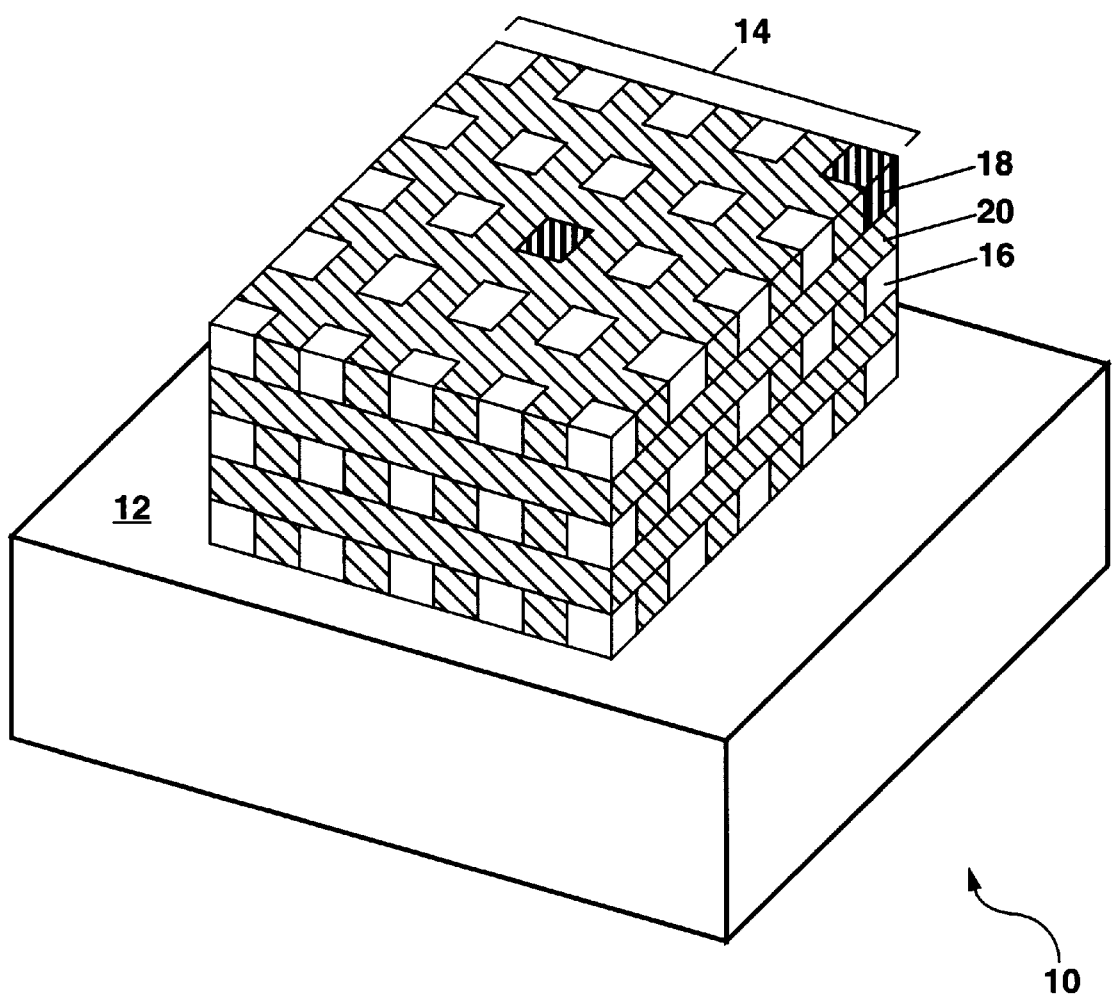
FIG. 4 shows a perspective view of a third example of a photonic crystal device according to the present invention, with the device comprising a plurality of spaced elements in the form of bits of material (also termed photonic atoms) separated by a spacer material, with at least one of the elements being replaced with an impurity element.

FIG. 4 shows a perspective view of a third example of a photonic crystal device 10 according to the present invention, with the device comprising a plurality of spaced elements 16 in the form of bits of material (also termed photonic atoms) separated by a spacer material 20, and further having at least one of the elements being substituted with an impurity element 18. The device of FIG. 4 may be formed in a manner similar to that described above for FIG. 3. Although the spaced elements 16 in FIG. 4 are shown as bits (i.e. photonic atoms) having a generally cubic shape, other shapes (e.g. cylindrical or spherical) may be used. An optimum or preferred shape for the bits for forming a particular photonic crystal device may be learned from practice of the present invention.

A number and a placement of the impurity elements 18 will in general depend upon a desired interaction with an EM wave that traverses through the photonic crystal 14 in the device 10 and may be learned from practice of the present invention. In the absence of any impurity elements 18, a regular periodicity of the spaced elements generates wavelength or frequency gaps in a transmission spectrum of the photonic crystal wherein propagation of EM waves is forbidden (i.e. a photonic bandgap). Thus, a photonic crystal device 10 having a regular periodicity of the spaced elements 16 may be used for forming a filter with a stop band over a predetermined range of wavelength or frequency (i.e. a band-rejection filter).

However, the presence of one or more impurity elements 18 may disturb an otherwise regular periodicity of the spaced elements 16, altering a propagation characteristic of an EM wave traversing the photonic crystal and allowing a substantial transmission of the EM wave through the crystal at a predetermined wavelength (or a wavelength range) for which the crystal would otherwise be strongly absorbing. Thus, by providing one or more impurity elements 18 within the photonic crystal 14 (i.e. "doping" the crystal), a photonic crystal device 10 may be provided in the form of a narrow-bandpass filter (i.e. a notch filter) having a predetermined range of wavelengths (or frequencies) for which an EM wave is transmitted, and absorbing waves outside the predetermined range.

As another example, an electromagnetic resonator may be formed by providing a photonic crystal device 10 comprising a pair of photonic crystals 14 with a predetermined periodicity of spaced elements and with the crystals being spatially separated by a cavity region that is preferably an integral multiple or sub-multiple (e.g. a multiple of one-half wavelength) of the wavelength of an EM wave propagating through the device. (In a single photonic crystal, such a cavity region may be provided by omitting a few rows of the spaced elements for providing a resonator for a single direction of propagation of an EM wave; or by omitting a plurality of adjacent spaced elements for providing a resonator for multiple directions of propagation of EM waves.) The cavity region may be filled with air or a dielectric material, with dimensions of the cavity region being dependent upon the wavelength of the EM wave to be provided to the resonator. The cavity region may be viewed as comprising impurity elements 18 introduced into an otherwise periodic photonic crystal, thereby forming a resonator having a quality factor or Q that is determined by a quantity and placement of the impurity elements. Such an electromagnetic resonator may provide a sharp discrete transmission peak within a photonic bandgap of the photonic crystal(s) due to a resonant transmission of the EM wave through a photonic bound state. The position of this transmission peak relative to the photonic bandgap depends on a width of the cavity region, and thus may tuned anywhere within the photonic bandgap by providing a predetermined dimension for the cavity region along the path of the EM wave.

According to other embodiments of the present invention, a photonic crystal device 10 may be provided in the form of a reflecting mirror or a beam director which alters a direction of propagation of an incident EM wave, reflecting or redirecting the EM wave; or in the form of a polarizer for polarizing an EM wave along a preferred polarization direction. Additional embodiments of the present invention may be provided in the form of an electromagnetic source (e.g. a laser or a light-emitting diode or arrays thereof) with an active region preferably being located within an electromagnetic resonator. The active region and resonator may be formed with a photonic crystal structure, with the photonic crystal providing a photonic bandgap for reducing or inhibiting spontaneous emission in the source. A reduction in the spontaneous emission is advantageous for reducing an excitation power for the electromagnetic source, and for reducing heating therein; thereby improving an efficiency and a reliability of the source. Furthermore, a reduction in the spontaneous emission allows modulation of the electromagnetic source at a higher frequency than otherwise would be possible. Further embodiments of the present invention may be provided as photonic crystal antennas for use in the millimeter and sub-millimeter regions of the electromagnetic spectrum. Such photonic crystal antennas may provide advantages for transmitting or receiving EM waves with a high efficiency and directionality.

Figure 5:
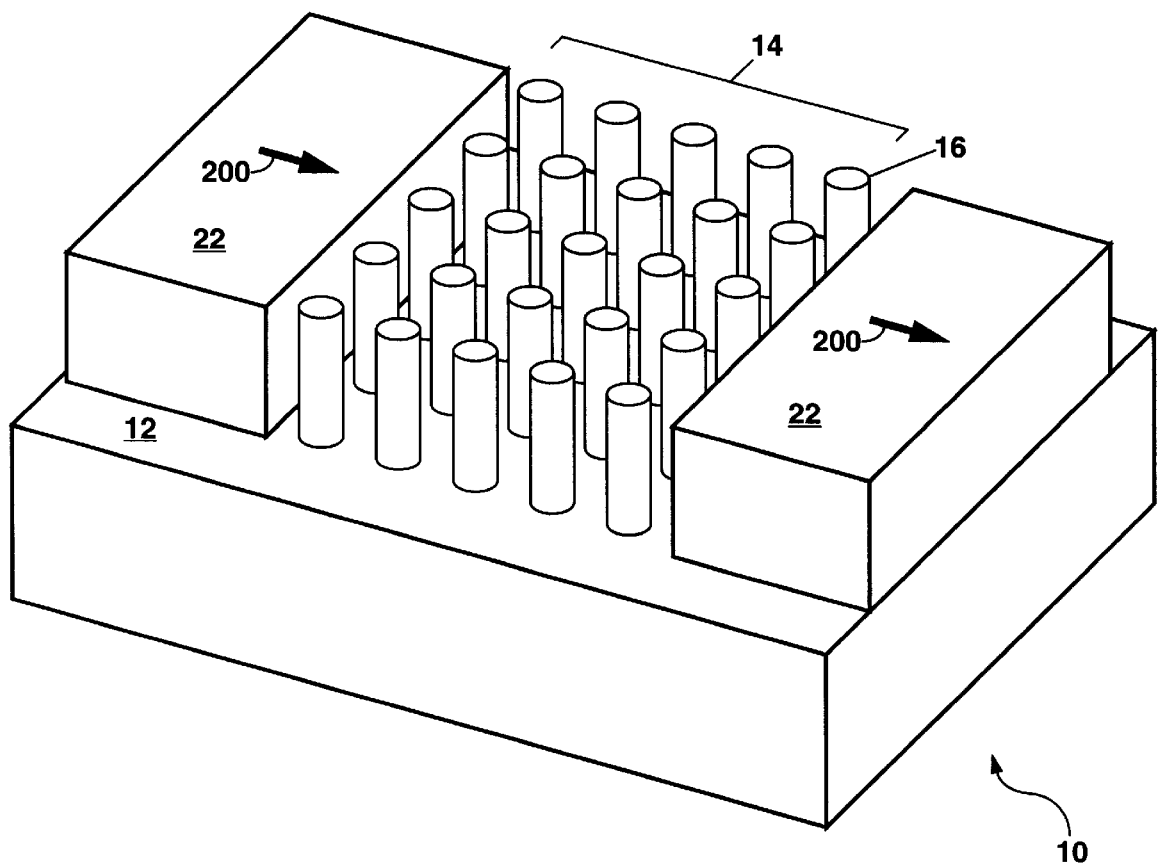
FIG. 5 shows a perspective view of a fourth example of a photonic crystal device according to the present invention, with the device comprising a photonic crystal formed on a substrate between a pair of electromagnetic (EM) waveguides.

FIG. 5 shows a perspective view of a fourth example of a photonic crystal device 10 according to the present invention, with the device comprising a photonic crystal 14 formed on a substrate 12 between a pair of EM waveguides 22. In FIG. 5, an EM wave 200 may be communicated between one or more of the waveguides and the photonic crystal 14. An interaction of an EM wave with the photonic crystal may be any of the types of interactions described heretofore (e.g. resonating, filtering, reflecting, redirecting, polarizing, transmitting and receiving). Furthermore, the photonic crystal device 10 in the form of an electromagnetic source may be used to generate one or more EM waves 200, with the waves being guided by one or more EM waveguides 22. According to some embodiments of the present invention, integrated electromagnetic circuits may be formed for operation at optical, infrared, or millimeter-wave frequencies, with the circuits comprising a plurality of interconnected photonic crystal devices 10 being formed on a common substrate 12.

The matter set forth in the foregoing description and accompanying drawings is offered by way of illustration only and not as a limitation. Other applications and variations of the photonic crystal device and method will become evident to those skilled in the art. As an example, spacer material 20 may be initially formed on a substrate by the charged-particle beam deposition method; and the spaced elements 16 may be subsequently formed by the charged-particle beam deposition method, by conventional deposition method (e.g. chemical vapor deposition, or sputter deposition), or by a spin-on deposition method. The actual scope of the invention is intended to be defined in the following claims when viewed in their proper perspective based on the prior art.

What is claimed is:

1. A photonic crystal device comprising:
   (a) a substrate; and
   (b) at least one photonic crystal formed on a surface of the substrate, each photonic crystal comprising a plurality of spaced elements having a composition different from the substrate, the elements further comprising a nonvolatile material formed from a sorbed precursor substance selected from the group consisting of organometallics, hydrocarbon compounds, and tungsten hexafluoride.

2. The photonic crystal device of claim 1 wherein the spaced elements are selected from the group consisting of upward-extending pillars, laterally-extending pillars, and bits.

3. The photonic crystal device of claim 1 wherein a majority of the spaced elements have a first index of refraction and at least one of the spaced elements has a second index of refraction different from the first index and forms an impurity element.

4. The photonic crystal device of claim 3 wherein the photonic crystal further includes a spacer material between the plurality of spaced elements, with the spacer material having a third index of refraction different from the first index.

5. The photonic crystal device of claim 1 wherein elements are spaced by a sub-multiple of a wavelength of an electromagnetic wave incident on the photonic crystal to provide an interaction with the electromagnetic wave.

6. A photonic crystal device comprising:
   (a) a substrate; and
   (b) at least one photonic crystal formed on a surface of the substrate, each photonic crystal comprising a plurality of spaced elements having a composition different from the substrate, the elements comprising a nonvolatile material formed from a sorbed precursor substance in the form of a hydrocarbon compound selected from the group consisting of dimethyl-gold-trifluoro-acetylacetonate and diethyl-gold-acetylacetonate.

7. A photonic crystal device comprising:
   (a) a substrate; and
   (b) at least one photonic crystal formed on a surface of the substrate, each photonic crystal comprising a plurality of spaced elements having a composition different from the substrate; and
   (c) at least one electromagnetic waveguide formed above the surface of the substrate and positioned adjacent to the photonic crystal for communication of an electromagnetic wave therewith.

8. The photonic crystal device of claim 7 wherein the elements comprise a nonvolatile material selected from the group consisting of organometallics, hydrocarbon compounds, and tungsten hexafluoride.

9. The photonic crystal device of claim 7 wherein the elements are selected from the group consisting of upward-extending pillars, laterally-extending pillars, and bits.

10. The photonic crystal device of claim 7 further including a spacer material between the plurality of spaced elements, the spacer material having an index of refraction different from the index of refraction of the spaced elements.

11. The photonic crystal device of claim 7 wherein the elements are spaced by a sub-multiple of a wavelength of the electromagnetic wave to provide an interaction with the electromagnetic wave.

12. A photonic crystal device comprising:
   (a) a substrate; and
   (b) at least one photonic crystal formed on a surface of the substrate, each photonic crystal comprising a plurality of spaced elements having a composition different from the substrate and further comprising a nonvolatile material formed from a sorbed precursor substance selected from the group consisting of organometallics, hydrocarbon compounds, and tungsten hexafluoride, with a majority of the spaced elements having a first index of refraction and at least one of the elements being in the form of an impurity element with a second index of refraction different from the first index.

13. The photonic crystal device of claim 12 wherein the sorbed precursor substance is a hydrocarbon compound selected from the group consisting of dimethyl-gold-trifluoro-acetylacetonate and diethyl-gold-acetylacetonate.

14. The photonic crystal device of claim 12 wherein the spaced elements are selected from the group consisting of upward-extending pillars, laterally-extending pillars, and bits.

15. The photonic crystal device of claim 12 wherein the elements have a periodicity that is a sub-multiple of a wavelength of an electromagnetic wave incident on the photonic crystal to provide an interaction with the electromagnetic wave.

16. The photonic crystal device of claim 15 wherein the spaced elements form a periodic array structure, and each impurity element provides a local disturbance in the periodic array structure to generate a defect mode, thereby forming an electromagnetic filter.

17. The photonic crystal device of claim 15 wherein a pair of photonic crystals are spaced about a cavity region to form an electromagnetic resonator.

18. The photonic crystal device of claim 15 wherein a number and placement of the impurity elements are selected to form an electromagnetic antenna.

19. The photonic crystal device of claim 15 wherein the photonic crystal device includes an active region to form an electromagnetic source.

20. The photonic crystal device of claim 15 wherein the interaction with the electromagnetic wave alters a direction of propagation of the electromagnetic wave.

21. The photonic crystal device of claim 12 wherein the photonic crystal further includes a spacer material between the plurality of spaced elements, with the spacer material having a composition different from both the substrate and any of the spaced elements.

22. The photonic crystal device of claim 12 further including a spacer material provided between the spaced elements, the spacer material having a third index of refraction different from the first index of refraction.

23. A photonic crystal device comprising:
   (a) a substrate; and
   (b) at least one photonic crystal formed on a surface of the substrate, each photonic crystal comprising a plurality of spaced elements having a composition different from the substrate, with a majority of the spaced elements having a first index of refraction and at least one of the elements being in the form of an impurity element with a second index of refraction different from the first index; and
   (c) at least one electromagnetic waveguide formed above the surface of the substrate and positioned adjacent to the photonic crystal for communication of an electromagnetic wave therewith.

24. The photonic crystal device of claim 23 wherein the spaced elements comprise a nonvolatile material formed from a sorbed precursor substance selected from the group consisting of organometallics, hydrocarbon compounds, and tungsten hexafluoride.

25. The photonic crystal device of claim 23 wherein the spaced elements are selected from the group consisting of upward-extending pillars, laterally-extending pillars, and bits.

26. The photonic crystal device of claim 23 further including a spacer material provided between the spaced elements, the spacer material having a third index of refraction different from the first index of refraction.

27. The photonic crystal device of claim 23 wherein the elements are spaced by a sub-multiple of a wavelength of the electromagnetic wave to provide an interaction with the electromagnetic wave.

28. The photonic crystal device of claim 27 wherein the spaced elements form a periodic array structure, and each impurity element provides a local disturbance in the periodic array structure to generate a defect mode, thereby forming an electromagnetic filter.

29. The photonic crystal device of claim 27 wherein a pair of photonic crystals are spaced about a cavity region to form an electromagnetic resonator.

30. The photonic crystal device of claim 27 wherein a number and placement of the impurity elements are selected to form an electromagnetic antenna.

31. The photonic crystal device of claim 27 wherein the photonic crystal device includes an active region to form an electromagnetic source.

32. A photonic crystal device comprising:
   (a) a substrate; and
   (b) at least one photonic crystal formed on a surface of the substrate, each photonic crystal comprising a plurality of spaced elements having a composition different from the substrate, the elements further comprising a nonvolatile material formed from a sorbed precursor substance selected from the group consisting of inorganic, organic, and metalorganic materials, with a majority of the spaced elements having a first index of refraction, and at least one of the spaced elements having a second index of refraction different from the first index and forming an impurity element.

33. The photonic crystal device of claim 32 further including at least one electromagnetic waveguide formed above the surface of the substrate and positioned adjacent to the photonic crystal for communication of an electromagnetic wave therewith.

* * * * *